(12) United States Patent

Friedman et al.

(10) Patent No.: US 7,309,832 B2
(45) Date of Patent: Dec. 18, 2007

(54) MULTI-JUNCTION SOLAR CELL DEVICE

(75) Inventors: Daniel J. Friedman, Lakewood, CO (US); John F. Geisz, Wheat Ridge, CO (US)

(73) Assignee: Midwest Research Institute, Kansas City, MO (US)

( * ) Notice: Subject to any disclaimer, the term of this patent is extended or adjusted under 35 U.S.C. 154(b) by 195 days.

(21) Appl. No.: 10/497,119

(22) PCT Filed: Dec. 14, 2001

(86) PCT No.: PCT/US01/48183

§ 371 (c)(1),
(2), (4) Date: May 27, 2004

(87) PCT Pub. No.: WO03/052836

PCT Pub. Date: Jun. 26, 2003

(65) Prior Publication Data

US 2004/0261837 A1   Dec. 30, 2004

(51) Int. Cl.
*H01L 31/00* (2006.01)

(52) U.S. Cl. .................. 136/262; 136/261

(58) Field of Classification Search ........... 136/249, 136/255, 261, 262; 438/74; 257/431, 461, 257/443

See application file for complete search history.

(56) References Cited

U.S. PATENT DOCUMENTS

| | | | |
|---|---|---|---|
| 4,278,474 A | 7/1981 | Blakeslee et al. | |
| 4,681,982 A | 7/1987 | Yoshida | |
| 4,963,508 A | 10/1990 | Umeno et al. | |
| 5,002,618 A | 3/1991 | Kanai et al. | |
| 5,009,719 A * | 4/1991 | Yoshida | 136/249 |

(Continued)

FOREIGN PATENT DOCUMENTS

| JP | 63217672 A | 9/1988 |
|---|---|---|
| JP | 09237909 A | 9/1997 |

OTHER PUBLICATIONS

Geisz et al, "Epitaxial growth of BGaAs and BGaInAs by MOCVD," preprint to be presented at the NCPV Program Review Meeting, Lakewood, CO, Oct. 14-17, 2001.*

(Continued)

*Primary Examiner*—Nam Nguyen
*Assistant Examiner*—Jeffrey Barton
(74) *Attorney, Agent, or Firm*—Paul J. White

(57) ABSTRACT

A multi-junction solar cell device (10) is provided. The multi-junction solar cell device (10) comprises either two or three active solar cells connected in series in a monolithic structure. The multi-junction device (10) comprises a bottom active cell (20) having a single-crystal silicon substrate base and an emitter layer (23). The multi-junction device (10) further comprises one or two subsequent active cells each having a base layer (32) and an emitter layer (23) with interconnecting tunnel junctions between each active cell. At least one layer that forms each of the top and middle active cells is composed of a single-crystal III-V semiconductor alloy that is substantially lattice-matched to the silicon substrate (22). The polarity of the active p-n junction cells is either p-on-n or n-on-p. The present invention further includes a method for substantially lattice matching single-crystal III-V semiconductor layers with the silicon substrate (22) by including boron and/or nitrogen in the chemical structure of these layers.

40 Claims, 1 Drawing Sheet

U.S. PATENT DOCUMENTS

| | | |
|---|---|---|
| 5,571,339 A | 11/1996 | Ringel et al. |
| 5,944,913 A | 8/1999 | Hou et al. |
| 6,100,546 A | 8/2000 | Major et al. |
| 6,281,426 B1 | 8/2001 | Olson et al. |
| 6,300,558 B1 | 10/2001 | Takamoto et al. |
| 6,815,736 B2 * | 11/2004 | Mascarenhas ............... 257/201 |

OTHER PUBLICATIONS

Geisz et al, "GaNPAs Solar Cells Lattice-Matched to GaP," IEEE, pp. 864-867, (2002).*

Geisz et al, "III-N-V semiconductors for solar photovoltaic applications," Semiconductor Science and Technology, vol. 17, No. 8, published Jul. 10, 2002.*

Geisz, et al., "BGaInAs Solar Cells Lattice-Matched to GaAs," Conference Record of the 28th Photovoltaic Specialist Conference, New York,: IEEE Sep. 15-22, 2000, pp. 990-993.

Richard Corkish, "Some candidate materials for lattice-matched liquid-phase epitaxial growth on silicon", Solar Cells, 31 (1991), pp. 537-548.

* cited by examiner

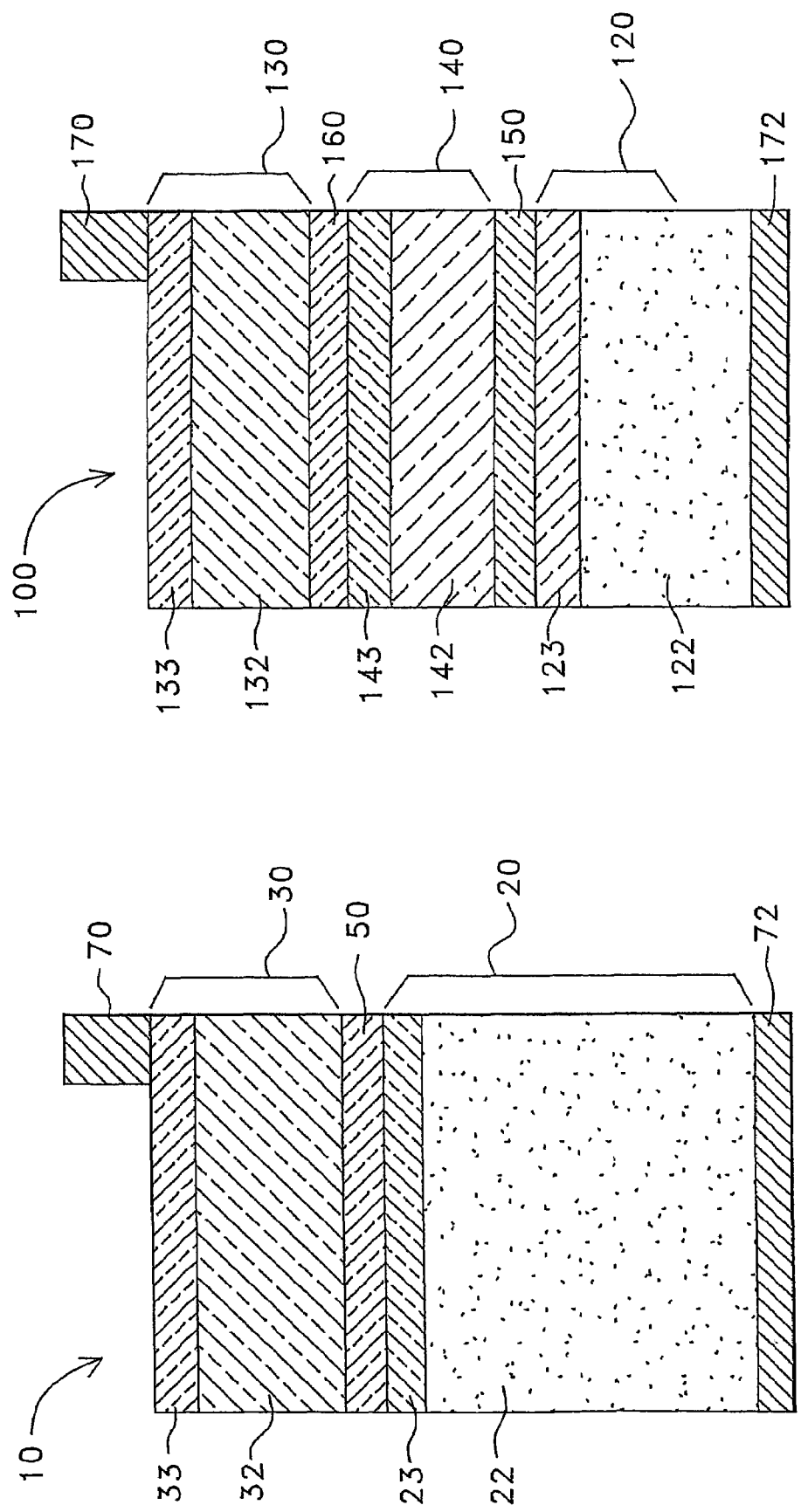

MULTI-JUNCTION SOLAR CELL DEVICE

CONTRACTUAL ORIGIN OF THE INVENTION

The United States Government has rights in this invention under Contract No. DE-AC36-99GO10337 between the U.S. Department of Energy and the National Renewable Energy Laboratory, a Division of Midwest Research Institute.

TECHNICAL FIELD

This invention relates generally to a multi-junction solar cell device and, more particularly, it relates to a multi-junction solar cell device containing III-V layers grown lattice-matched on silicon substrates.

BACKGROUND ART

Solar photovoltaic devices, i.e., solar cells, are devices capable of converting solar radiation into usable electrical energy. The energy conversion occurs as the result of what is known as the photovoltaic-effect which occurs in a cell composed of a p-type semiconductor layer adjacent to an n-type semiconductor layer, hereafter referred to as a p-n junction cell. Solar radiation impinging on a solar cell and absorbed by an active region of semiconductor material generates electricity.

Multi-junction solar cells may be more efficient than single-junction solar cells if properly designed. One such design is described in U.S. Pat. No. 5,223,043 issued to Olson et al. Important considerations to achieve high efficiency energy conversion include the following: a) high quality crystalline layers; b) appropriate choice of junction band-gaps based on the impinging solar spectrum; c) tunnel junction interconnects between p-n junctions; d) appropriate choice of layer thicknesses to achieve a current-matched structure; and e) passivating layers, such as back-surface-field layers or window layers, to reduce losses. In the past, high-efficiency III-V semiconductor multi-junction solar cells have been grown on GaAs, InP, and Ge substrates, but silicon substrates have been found advantageous for cost and mechanical robustness reasons.

Alloys containing the atoms (AlGaIn)(PAsSb) are examples of III-V semiconductors, so named because their constituent elements come from the columns IIIb and Vb of the periodic table. In the past, solar cells consisting of high-quality, single-crystal layers of (AlGaIn)(PAsSb) semiconductor alloys with a large range of optical properties have been grown on GaAs, InP, and Ge substrates because these alloys can be fabricated with compositions such that the crystal lattice parameter and crystal symmetry match that of the underlying substrate. This "lattice-matching" condition results in epitaxial layers with minimal strain, few defects and thus superior electrical properties. Unfortunately, the set of semiconductors alloys (AlGaIn)(PAsSb) cannot be lattice-matched to silicon for any composition.

In the past, many investigators have attempted to grow III-v solar cells on single-crystal silicon substrates. Blakeslee et al. (U.S. Pat. No. 4,278,474), Umeno et al. (U.S. Pat. No. 4,963,508), and Ringel et al. (U.S. Pat. No. 5,571,339) have all disclosed lattice-mismatched III-V solar cell devices grown on silicon substrates using strain-relieving buffer layers. But because these III-V solar cell designs are not lattice-matched to the underlying silicon, problems with high defect densities in the III-V semiconductor layers have prevented such solar cell designs from achieving efficiencies as high as those on GaAs or Ge substrates.

The addition of small amounts of boron (B) and/or nitrogen (N) to the more standard III-V alloys does allow for compositions lattice-matched to silicon to be reached. For example, $GaN_xP_{1-x-y}As_y$ is lattice-matched to silicon for $0.022 < x < 0.194$ and $y = 4.6x - 0.09$. The ability to fabricate these semiconductor alloys with nitrogen or boron concentrations greater than about 0.1% has only recently been discovered and the achievable compositions and their properties are under current investigation.

In the recent past, $GaN_xP_{1-x}$, $GaIn_yN_xP_{1-x}$, and $GaN_xP_{1-x-y}As_y$ have been grown on Gap and Si substrates for light emitting applications. $GaN_xP_{1-x}$ has also been shown to have a direct (or direct-like) band gap. $B_xGa_{1-x-y}In_yAs$ has been grown on GaAs, but would require considerably greater concentrations of boron to be lattice-matched to silicon. $B_xGa_{1-x}P$ has not been attempted but would have a much better chance to be lattice-matched with silicon than $B_xGa_{1-x-y}In_yAs$. All of these III-V semiconductors have typically been grown using metal-organic vapor phase epitaxy (MOVPE), molecular beam epitaxy (MBE), and similar techniques.

DISCLOSURE OF THE INVENTION

The present invention is a multi-junction solar cell device. The multi-junction solar cell device comprises either two or three active solar cells connected in series in a monolithic structure. The multi-junction device comprises a bottom active cell having a single-crystal silicon substrate base and an emitter layer. The multi-junction device further comprises one or two subsequent active cells, each of which has a base layer and an emitter layer and wherein there is an interconnecting tunnel junction between two adjacent active cells. At least one layer that forms each of the top and middle active cells comprises a single-crystal III-V semiconductor alloy that is substantially lattice-matched to the silicon substrate. The polarity of the active p-n junction cells in the multi-junction device can be either p-on-n or n-on-p.

The present invention further includes a method for substantially lattice matching an active III-V solar cell or cells with an active silicon solar cell formed from a silicon substrate in a multi-junction solar cell device. The method comprises forming the bottom active cell from a silicon substrate, and forming the top active cell or cells with at least one III-V semiconductor layer which contains boron and/or nitrogen. The general composition of the III-V semiconductor layer, $B_xAl_yGa_{1-x-y-z}In_zN_sP_{1-s-t-u}As_tSb_u$, hereafter referred to as (BAlGaIn)(NPAsSb), can be lattice matched to a silicon substrate only when boron and/or nitrogen compositions are greater than zero. The quatemary alloys:

$(GaN_{0.02}P_{0.98})_{1-n}(GaN_{0.19}As_{0.81})_n$, hereafter referred to as GaNPAs; and $(GaN_{0.02}P_{0.98})_{1-n}(InN_{0.47}P_{0.53})_n$, hereafter referred to as GaInNP; and $(B_{0.25}Ga_{0.75}As)_{1-n}(B_{0.02}Ga_{0.98}P)_n$, hereafter referred to as BGaPAs, which are substantially lattice matched to silicon at room temperature for $0 < n < 1$, make up a subset of the potential list of alloys of the general form (BAlGaIn)(NPAsSb) that are substantially lattice matched to silicon. The quatemary alloys listed above are the most likely alloys to be used in the present invention due to their relative simplicity in composition and their useful range of band gaps.

The lattice matching condition is temperature dependent because the thermal expansion coefficient of silicon is different from that of III-V semiconductors. Since these III-V semiconductor layers are typically grown at elevated temperatures, it may be more beneficial to lattice match the III-V semiconductor layers to silicon substrates at growth temperature rather than room temperature. When cooled to room temperature, III-V semiconductor layers that have been lattice matched at growth temperature will be slightly lattice mismatched, but should also be considered "substantially lattice matched."

In addition, GaP and $Al_xGa_{1-x}P$ are only slightly lattice mismatched with silicon substrates, but it may be argued that they are not "substantially lattice-matched with silicon." While their high band gaps and slight lattice mismatch with silicon do not allow them to be useful as thicker light absorbing layers in the present invention, relatively thin layers of GaP and AlGaP within the structure of the present invention do not significantly affect the degree to which the relatively thick active solar cells on silicon substrates are strained. Thus, the active cell which contains a relatively thin GaP or AlGaP layer does not develop strain-related defects and the entire active cell is considered substantially lattice-matched with silicon.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings:

FIG. 1 is a sectional view illustrating a two-junction solar cell device, constructed in accordance with the present invention; and FIG. 2 is a sectional view illustrating a three-junction solar cell device, constructed in accordance with the present invention.

DETAILED DESCRIPTION OF THE PREFERRED EMBODIMENTS

As illustrated in FIGS. 1 and 2, the present invention is a multi-junction solar cell device, indicated generally in its two-junction version as 10 and in its three-junction version as 100, having lattice-matched (BAlGaIn)(NPAsSb) alloys grown on silicon. The solar cell device 10 rivals the efficiencies of high-efficiency cells on GaAs or Ge, with significant cost savings and improvements in mechanical stability.

As illustrated in FIG. 1, the two-junction version of the solar cell device 10 of the present invention includes a single-crystal silicon substrate 22. The two-junction device 10 comprises a bottom active cell 20, a top active cell 30, and an interconnecting tunnel junction layer 50. The bottom active cell 20 comprises at least a p-type (or n-type) base layer formed within the silicon substrate 22 and an n-type (or p-type) emitter layer 23 forming a p-n junction. The top active cell 30 comprises at least a p-type (or n-type) base layer 32 and an n-type (or p-type) emitter layer 33 also forming a p-n junction. The top active cell 30 comprises at least one nitrogen and/or boron containing a III-v semiconductor absorbing layer with the general composition of (BAlGaIn)(NPAsSb) which has a direct (or direct-like) band gap of approximately 1.6 eV to approximately 1.8 eV thereby optimizing the efficiency of the entire multi-junction solar cell device 10. Si, GaP, AlGaP, or various compositions of (BAlGaIn)(NPAsSb) which are substantially lattice-matched to the silicon substrate 22 would be used in the bottom emitter layer 23, the top emitter layer 33 and the top base layer 32. Under solar radiation both the top active cell 30 and bottom active cell 20 convert the absorbed portion of the solar spectrum into electrical energy. The tunnel junction 50 is used to facilitate the flow of photogenerated electrical current between the bottom active cell 20 and the top active cell 30. The tunnel junction 50 may take a number of forms to provide a thin layer 50 of materials that allows current to pass between cells 20 and 30 without generating a voltage drop large enough to significantly decrease the conversion efficiency of the solar cell device 10, and that preserves the lattice-matching between cells 20 and 30. The photogenerated electrical energy is used or stored in an external circuit connected to the metal contacts 70 and 72. The top active cell 30 and bottom active cell 20 may also contain passivating layers, commonly referred to as back-surface-field or window layers, to minimize electrical losses. The use of these passivating layers is commonly understood among those skilled in the art.

In a preferred embodiment of the present invention described above, the compositions of (BAlGaIn)(NPAsSb) substantially lattice matched to the silicon substrate would be chosen from the group of quaternary alloys; GaNPAs, GaInNP, or BGaPAs specified previously. The following is a detailed description of a preferred embodiment to illustrate the spirit of the two-junction device 10 of the present invention as illustrated in FIG. 1. It should be noted, as understood by a person skilled in the art, that other embodiments of the device 10 are within the scope of the present invention.

In this example, III-V semiconductors are grown on a single-crystal p-type silicon wafer 22 by MOVPE. Source materials would include triethylgallium, phosphine, tertiary-butyl arsine, and dimethylhydrazine. Growth temperatures would be between 600°-700° C.

The first layer deposited on the silicon substrate 22 would be a window layer of 0.1 μm GaP doped highly n-type with Se from hydrogen selenide. Some of the phosphorus from this layer would diffuse into the silicon substrate 22 during growth forming a thin n-type emitter layer 23 within the silicon substrate 22 Next a 0.05 μm thick GaP layer doped highly p-type with carbon from $CCl_4$ together with the n-type GaP window layer would form the tunnel junction 50. A p-type Zn-doped back-surface-field for the top active cell 30 composed of 0.1 μm GaP would then be deposited on the tunnel junction 50. A 1.0 μm $GaN_{0.07}As_{0.23}P_{0.70}$ top base layer 32 with a band gap of approximately 1.65 eV would serve as the primary absorbing layer of the top active cell 30. The $GaN_{0.07}As_{0.23}P_{0.70}$ base 32 is not intentionally doped but has a background p-type doping level of approximately $1 \times 10^{16}$ $cm^{-3}$. The top emitter 33 is composed of 0.1 μm Se-doped GaP. A 0.1 μm thick highly Se-doped GaAs contact layer is deposited on the top emitter 33. This GaAs contact layer is removed except beneath the metal grid 70 after the Au/Sn/Au metal grids 70 are deposited by vacuum evaporation and standard photolithography techniques. A gold back-side contact 72 is also evaporated on the back of the device 10. A broadband two layer anti-reflective coating is finally deposited on the front of the device 10. The thickness and composition of the $GaN_{0.07}As_{0.23}P_{0.70}$ top base layer 32 would be adjusted slightly to achieve a current-matched structure to optimize the efficiency of the entire device 10.

As illustrated in FIG. 2, the three-junction version of the solar cell device 100 of the present invention includes a single-crystal silicon substrate 122. The three-junction device 100 comprises a bottom active cell 120, a middle active cell 140, a top active cell 130, and two interconnecting tunnel junction layers 150 and 160. The bottom active cell 120 comprises at least a p-type (or n-type) base layer 122 formed within the silicon substrate 122 and an n-type (or p-type) emitter layer 123 forming a p-n junction. The top active cell 130 comprises at least a p-type (or n-type) base layer 132 and an n-type (or p-type) emitter layer 133 also forming a p-n junction. The top active cell 130 comprises at least one nitrogen and/or boron containing a III-V semiconductor absorbing layer with the general composition of (BAlGaIn)(NPAsSb) which has a direct (or direct-like) band gap of approximately 1.8 eV to approximately 2.0 eV thereby optimizing the efficiency of the entire multi-junction solar cell device 100. The middle active cell 140 comprises at least a p-type (or n-type) base layer 142 and an n-type (or p-type) emitter layer 143 also forming a p-n junction. The middle active cell 140 comprises at least one nitrogen and/or boron containing III-V semiconductor absorbing layer with the general composition of (BAlGaIn)(NPAsSb) which has a direct (or direct-like) band gap of approximately 1.4 eV to approximately 1.5 eV thereby optimizing the efficiency of the entire multi-junction solar cell device 100. Si, GaP, AlGaP, or various compositions of (BAlGaIn)(NPAsSb) which are substantially lattice-matched to the silicon substrate 122 would be used in the bottom emitter layer 123, the middle emitter layer 143, the middle base layer 142, the top emitter layer 133 and the top base layer 132. Under solar radiation the three active cells 120, 130, and 140 each convert the absorbed portion of the solar spectrum into electrical energy. The tunnel junction 150 is used to facilitate the flow of photogenerated electrical current between the active cells 120 and 140. The tunnel junction 160 is used to facilitate the flow of photogenerated electrical current between the active cells 140 and 130. The tunnel junctions 150 and 160 may take a number of forms that allows current to pass between cells 120, 140, and 130 without generating a voltage drop large enough to significantly decrease the conversion efficiency of the solar cell device 100, and that preserves the lattice-matching between cells 120, 140, and 130. The photogenerated electrical energy is used or stored in an external circuit connected to the metal contacts 170 and 172. The active cells 120, 140, and 130 may also contain passivating layers, commonly referred to as back-surface-field or window layers, to minimize electrical losses. The use of these passivating layers is commonly understood among those skilled in the art.

In an example embodiment of the three-junction version of the solar cell device 100 of the present invention, the compositions of (BAlGaIn)(NPAsSb) substantially lattice matched to the silicon substrate may be chosen from the group of quaternary alloys; GaNPAs, GaInNP, or BGaPAs previously discussed above.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

The invention claimed is:

1. A multi-junction, monolithic solar cell device for converting solar radiation into electrical energy, the multi-junction solar cell device comprising:
   a bottom active cell having a single-crystal silicon substrate base and a bottom emitter layer, which together farm a first p-n junction;
   a top active cell having a top base layer and a top emitter layer which together form a second p-n junction, and wherein the top active cell includes at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base; and
   a tunnel junction layer interposed between the bottom active cell and the top active cell for facilitating electrical current flow between the bottom active cell and the top active cell.

2. The multi-junction solar cell device of claim 1 wherein the III-V semiconductor layer in the top active cell has a direct band-gap in a range of 1.6 eV to 1.8 eV.

3. The multi-junction solar cell device of claim 2 wherein each of the bottom emitter and the top emitter comprises layer of material selected from the group consisting of Si, Gap, AlGaP, and at least one composition of (BAlGaIn)(NPAsSb) that includes boron and/or nitrogen and is either lattice-matched to the silicon substrate base or thin enough to not develop strain-related defects, and wherein the top base layer comprises a layer of material selected from the group consisting of Si, GaP, AlGaP, and at least one composition of (BAlGaIn)(NPAsSb) that includes boron and/or nitrogen and is either lattice-matched to the silicon substrate base or thin enough to not develop strain-related defects.

4. The multi-junction solar cell device of claim 3 wherein the compositions of (BAlGaIn)(NPAsSb) lattice-matched to the silicon substrate base are selected from the group of quaternary alloys consisting of GaNPAs, GaInNP, and BGaPAs.

5. The multi-junction, monolithic solar cell device of claim 1, wherein the III-V semiconductor layer is deposited at a growth temperature and is lattice-matched to the silicon substrate base at the growth temperature.

6. A-multi-junction, monolithic solar cell device for converting solar radiation into electrical energy, the multi-junction solar cell device comprising:
   a bottom active cell having a first p-n junction formed by a single-crystal silicon substrate base and a bottom emitter layer;
   a middle active cell having a second p-n junction formed by a middle base layer and a middle emitter layer wherein the middle active cell contains at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base;
   a top active cell having a third p-n junction formed by a top base layer and a top emitter layer wherein the top active cell contains at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base;
   a first tunnel junction layer interposed between the bottom active cell and the middle active cell for facilitating electrical current flow between the bottom active cell and the middle active cell; and a second tunnel junction layer interposed between the middle active cell and the top active cell for facilitating electrical current flow between the middle active cell and the top active cell;

wherein the top active cell and the middle active cell are substantially lattice-matched to the silicon substrate base.

7. The multi-junction solar cell device of claim 6 wherein the III-V semiconductor layer in the top active cell has a direct band-gap in a range of 1.8 eV to 2.0 eV.

8. The multi-junction solar cell device of claim 7 wherein the III-V semiconductor layer in the middle active cell has a direct band-gap in a range of 1.4 eV to 1.5 eV.

9. The multi-junction solar cell device of claim 8 wherein each of the bottom emitter, the middle emitter, and the top emitter, comprises a material selected from the group Consisting of Si, GaP, AlGaP and at least one composition of(BAlGaIn)(NPAsSb) that includes boron and/or nitrogen and is either lattice-match to the silicon substrate or thin enough to not develop strain-related defects, and wherein each of the middle base and the top base comprises a layer of material selected from the group consisting of Si, GaP, AlGaP, and at least one composition of (BAlGaIn)(NPAsSb) that includes boron and/or nitrogen and is either lattice-matched to the silicon substrate base or thin enough to not develop strain-related defects.

10. The multi-junction solar cell device of claim 9 wherein the compositions of(BAlGaIn)(NPAsSb) lattice-matched to the silicon substrate are selected from the group of quaternary alloys consisting of GaNPAs, GaInNP, and BGaPAs.

11. The multi-junction, monolithic solar cell device of claim 6, wherein the III-V semiconductor layer is deposited at a growth temperature and is lattice-matched to the silicon substrate base at the growth temperature.

12. A method of forming a solar cell for converting solar radiation into electrical energy, the method comprising:

forming a first p-n junction with a bottom active cell having a single-crystal silicon substrate base and a bottom emitter layer;

forming a second p-n junction with a top active cell having a top base layer and a top emitter, the top active cell containing at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base;

facilitating electrical current flow between the bottom active cell and the top active cell; and lattice-matching the top active cell to the silicon substrate base.

13. The method of claim 12 wherein the III-V semiconductor layer in the top active cell has a direct band-gap in a range of 1.6 eV to 1.8 eV.

14. The method of claim 13 wherein each of the bottom emitter and the top emitter comprises a layer of material selected from the group consisting of Si, GaP, ALGaP, and at least one composition of (BAlGaIn)(NPAsSb) that includes boron and/or nitrogen and is either lattice-matched to the silicon substrate base or thin enough to not develop strain-related detects, and wherein the top base comprises a layer of material selected from the group consisting of Si, GaP, AlGaP, and at least one composition of (BAlGaIN)(NPAsSb) that includes boron and/or nitrogen and is either lattice-matched to the silicon substrate base or thin enough to not develop strain-related defects.

15. The method of claim 14 wherein the compositions of (BAlGaIn)(NPAsSb) lattice-matched to the silicon substrate base are selected from the group of quaternary alloys consisting of GaNPAs, GaInNP, and BGaPAs.

16. The method of claim 12, including depositing the III-V semiconductor layer at a growth temperature and lattice-matching the III-V semiconductor layer to the silicon substrate base at the growth temperature.

17. A method of forming a solar cell for converting solar radiation into electrical energy, the method comprising:

forming a first p-n junction with a bottom active cell having a single-crystal silicon substrate base and a bottom emitter layer;

forming a second p-n junction with a middle active cell having a middle base layer and a middle emitter layer, the middle active cell containing at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base;

forming a third p-n junction with a top active cell having a top base layer and a top emitter layer, the top active cell containing at least one III-V semiconductor layer that includes at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate base;

facilitating electrical current flow between the bottom active cell and the middle active cell;

facilitating electrical current flow between the middle active cell and the top active cell; and lattice-matching the top active cell and the middle active cell.

18. The method of claim 17 wherein the III-V semiconductor layer in the top active cell has a direct band-gap in a range of 1.8 eV to 2.0 eV.

19. The method of claim 18 wherein the (BAlGaIn)(NPAsSb) layer in the middle active cell has a direct band-gap in a range of 1.4 eV to 1.5 eV.

20. The method of claim 19 wherein each of the bottom emitter, the middle emitter, and the top emitter comprises a layer of material selected from the group consisting of Si, GaP, AlGaP, and at least one composition of (BalGaIn)(NPAsSb) that includes boron and/or nitrogen and is either lattice-matched to the silicon substrate base or thin enough to not develop strain-related defects, and each of the middle base and the top base comprises a layer of material selected from the group consisting of Si, GaP, AlGaP, and at least one composition of (BAlGaIn)(NPAsSb) that includes baton and/or nitrogen and is either lattice-matched to the silicon substrate base or thin enough to not develop strain-related defects.

21. The method of claim 20 wherein the compositions of (BAlGaIn)(NPAsSb) lattice-matched to the silicon substrate base are selected from the group of quaternary alloys consisting of GaNPAs, GaInNP, and BGaPAs.

22. The method of claim 17, including depositing the III-V semiconductor layer at a growth temperature and lattice-matching the III-V semiconductor layer to the silicon substrate base at the growth temperature.

23. A photovoltaic device, comprising:

a single-crystal silicon substrate comprising a first base layer;

a first emitter layer forming a first p-n junction with the base layer;
a second base layer;
a second emitter layer forming a second p-n junction with the second base layer; and
a first tunnel junction layer between the first emitter layer and second base layer for facilitating electrical current flow therebetween,
wherein at least one of the second base layer and second emitter layer comprise a layer of III-V semiconductor alloy comprising at least one of $(GaN_{0.02}P_{0.98})_{1-n}(GaN_{0.19}As_{0.81})_n$, $(GaN_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, that is lattice-matched to the silicon substrate.

24. The photovoltaic device of claim 23, wherein the first emitter layer comprises a layer in the silicon substrate.

25. The photovoltaic device of claim 24 wherein the layer of III-V semiconductor alloy has a direct band-gap in a range of 1.6 eV to 1,8 eV.

26. The photovoltaic device of claim 23, further comprising:
a third base layer;
a third emitter layer forming a third p-n junction with the third base layer; and
a second tunnel junction layer between the second emitter layer and third base layer for facilitating electrical current flow therebetween,
wherein at least one of the third base layer and third emitter layer comprises a layer of III-V semiconductor alloy that includes at least one of $(GaN_{0.02}P_{0.98})_{1-n}(GaN_{0.19}As_{0.81})_n$, $(Ga_{0.02}P_{0.98})_{1-n}(InN_{0.47}P_{0.53})_n$, and $(B_{0.25}Ga_{0.75}As)_{1-n}(B_{0.02}Ga_{0.98}P)_n$, where $0<n<1$, and that is lattice-matched to the silicon substrate.

27. The photovoltaic device of claim 26, wherein the III-V semiconductor alloy in at least one of the second base layer and second emitter layer has a band-gap in a range of 1.4 eV to 1.5 eV, and the III-V semiconductor alloy In at least one of the third base layer and third emitter layer has a band-gap in a range of 1.8 eV to 2.0 eV.

28. The photovoltaic device of claim 24, wherein the first base layer comprises a p-type layer of the silicon substrate, the first emitter layer comprises an n-type layer of the silicon substrate, the second base layer comprises a layer of p-type GaNAsP, and the second emitter layer comprises a layer of n-type GaP.

29. The photovoltaic device of claim 23, wherein the layer of III-V semiconductor alloy is deposited at a growth temperature and is lattice-matched to the silicon substrate at the growth temperature.

30. A multi-junction, monolithic solar cell device for converting solar radiation into electrical energy, the multi-junction solar cell device comprising:
a bottom active cell having a single-crystal silicon substrate base and a bottom emitter layer, which together form a first p-n junction;
a top active cell having a top base layer and a top emitter layer which together form a second p-n junction, and wherein the top active cell includes at least one III-V semiconductor layer that includes $GaN_xP_{1-x-y}As_y$, where $0.022<x<0.194$ and $y=4.6x-0.09$, and that is lattice-matched to the silicon substrate base; and
a tunnel junction layer interposed between the bottom active cell and the top active cell for facilitating electrical current flow between the bottom active cell and the tap active cell.

31. The multi-junction, monolithic solar cell device of claim 30, wherein the III-V semiconductor layer is deposited at a growth temperature and is lattice-matched to the silicon substrate base at the growth temperature.

32. A multi-junction, monolithic solar cell device for converting solar radiation into electrical energy, the multi-junction solar cell device comprising:
a bottom active cell having a first p-n junction formed by a single-crystal silicon substrate base and a bottom emitter layer;
a middle active cell having a second p-n junction formed by a middle base layer and a middle emitter layer wherein the middle active cell contains at least one III-V semiconductor layer that includes $GaN_xP_{1-x-y}As_y$, where $0.022<x<0.194$ and $y=4.6x-0.09$ and that is lattice-matched to the silicon substrate base;
a top active cell having a third p-n junction formed by a top base layer and a top emitter layer wherein the top active cell contains at least one III-V semiconductor layer that includes $GaN_xP_{1-x-y}As_y$, where $0.022<x<0.194$ and $y=4.6x-0.09$, and that is lattice-matched to the silicon substrate base;
a first tunnel junction layer interposed between the bottom active cell and the middle active cell for facilitating electrical current flow between the bottom active cell and the middle active cell; and
a second tunnel junction layer interposed between the middle active cell and the top active cell for facilitating electrical current flow between the middle active cell and the top active cell;
wherein the top active cell and the middle active cell are substantially lattice-matched to the silicon substrate base.

33. The multi-junction, monolithic solar cell device of claim 32, wherein the III-V semiconductor layer is deposited at a growth temperature and is lattice-matched to the silicon substrate base at the growth temperature.

34. A method of forming a solar cell for convening solar radiation into electrical energy, the method comprising:
forming a first p-n junction with a bottom active cell having a single-crystal silicon substrate base and a bottom emitter layer;
forming a second p-n junction with a top active cell having a top base layer and a top emitter, the top active cell containing at least one III-V semiconductor layer that includes $GaN_xP_{1-x-y}As_y$, where $0.022<x<0.194$ and $y=4.6x-0.09$, and that is lattice-matched to the silicon substrate base;
facilitating electrical current flow between the bottom active cell and the top active cell; and
lattice-matching the top active cell to the silicon substrate base.

35. The method of claim 34, including depositing the III-V semiconductor layer at a growth temperature and lattice-matching the III-V semiconductor layer to the silicon substrate base at the growth temperature.

36. A method of forming a solar cell for converting solar radiation into electrical energy, the method comprising:
forming a first p-n junction with a bottom active cell having a single-crystal silicon substrate base and a bottom emitter layer;
forming a second p-n junction with a middle active cell having a middle base layer and a middle emitter layer, the middle active cell containing at least one III-V semiconductor layer that includes $GaN_xP_{1-x-y}As_y$, where $0.022<x<0.194$ and $y=4.6x-0.09$, and that is lattice-matched to the silicon substrate base;
forming a third p-n junction with a top active cell having a top base layer and a top emitter layer, the top active cell containing at least one III-V semiconductor layer that includes $GaN_xP_{1-x-y}As_y$, where $0.022<x<0.194$ and $y=4.6x-0.09$, and that is lattice-matched to the silicon substrate base;

facilitating electrical current flow between the bottom active cell and the middle active cell;

facilitating electrical current flow between the middle active cell and the top active cell; and lattice-matching the top active cell and the middle active cell.

37. The method of claim 36, including depositing the III-V semiconductor layer at a growth temperature and lattice-matching the III-V semiconductor layer to the silicon substrate base at the growth temperature.

38. A photovoltaic device, comprising:
   a single-crystal silicon substrate comprising a first base layer;
   a first emitter layer forming a first p-n junction with the base layer;
   a second base layer;
   a second emitter layer forming a second p-n junction with the second base layer; and
   a first tunnel junction layer between the first emitter layer and second base layer for facilitating electrical current flow therebetween,
   wherein at least one of the second base layer and second emitter layer comprise a layer of III-V semiconductor alloy comprising $GaN_xP_{1-x-y}As_y$, where $0.022<x<0.194$ and $y=4.6x-0.09$, that is lattice-matched to the silicon substrate.

39. The photovoltaic device of claim 38, further comprising:
   a third base layer;
   a third emitter layer tuning a third p-n junction with the third base layer; and
   a second tunnel junction layer between the second emitter layer and third base layer for facilitating electrical current flow therebetween,
   wherein at least one of the third base layer and third emitter layer comprises a layer of III-V semiconductor alloy that includes $GaN_xP_{1-x-y}As_y$, where $0.022<x<0.194$ and $y=4.6x-0.09$, and that is lattice-matched to the silicon substrate.

40. The photovoltaic device of claim 38, wherein the layer of III-V semiconductor alloy is deposited at a growth temperature and is lattice-matched to the silicon substrate at the growth temperature.

* * * * *